United States Patent [19]

Thackery

[11] 4,132,255
[45] Jan. 2, 1979

[54] TRACTOR MOUNTED LOG SPLITTING APPARATUS

[76] Inventor: Russell H. Thackery, 2376 Brentwood Rd., Columbus, Ohio 43209

[21] Appl. No.: 796,059

[22] Filed: May 12, 1977

[51] Int. Cl.$^2$ .............................................. A47J 49/02
[52] U.S. Cl. ................................... 144/193 R; 74/15; 144/194; 180/53 WA
[58] Field of Search ................. 180/19, 53 R, 53 WA; 74/13, 15, 15.6, 15.63, 15.69; 144/193 R, 193 A, 193 D, 3 K, 194, 309 R, 321

[56] References Cited

U.S. PATENT DOCUMENTS

| | | | |
|---|---|---|---|
| 1,226,785 | 5/1917 | McCargan | 74/15.63 X |
| 1,538,881 | 5/1925 | Barton | 74/15.63 X |
| 2,137,940 | 11/1938 | Goodman | 180/53 WA |
| 2,549,317 | 4/1951 | Laughlin | 180/19 R X |
| 2,655,957 | 10/1953 | Lagant | 180/19 R |
| 2,888,087 | 5/1959 | Duncan | 180/19 R X |
| 2,926,736 | 3/1960 | Lee, Jr. | 180/19 R X |
| 3,993,113 | 11/1976 | Thackery | 144/193 D |
| 4,026,337 | 5/1971 | Thackery | 144/193 R |
| 4,027,709 | 6/1977 | Thackery | 144/193 R |

FOREIGN PATENT DOCUMENTS 182212  6/1955  Australia .............................. 144/193 R Primary Examiner—Othell M. Simpson
Assistant Examiner—W. D. Bray
Attorney, Agent, or Firm—Mahoney & Stebens

[57] ABSTRACT

A tractor mounted log splitting apparatus is provided having a log splitting tool and log stop bar and support assembly which are adapted for mounted interengagement with power drive means attached to the tractor and projecting laterally outward from a frame structure thereof. The tractor includes a frame engine power unit and driving wheels mounted thereon with power drive means extending axially forward of the frame. This apparatus also includes a rear stabilizing support adapted to be secured to a rear portion of the tractor frame. The log splitting tool includes a conically shaped splitter head provided with a spiral auger surface and an axial mounting and drive shaft which extends from the base of the splitter head and which shaft is mechanically interengageable with the power drive means. The log stop bar and support assembly also functions as a front stabilizing support stand and includes a stop bar that is positioned to extend parallel and in spaced relationship to the conical surface of the splitter head. In this tractor mounted log splitting apparatus combination, the power drive means and the log splitting tool with stop bar are selectively positionable in either a horizontal operable position or in a vertically oriented transport position.

21 Claims, 5 Drawing Figures

TRACTOR MOUNTED LOG SPLITTING APPARATUS

BACKGROUND OF THE INVENTION

This invention is directed to a log splitting apparatus that is specifically designed for mounting on and incorporation in a garden type tractor and in particular, a garden-type tractor having only two drive or transport wheels. This apparatus is designed for utilizing existing components and equipment provided as auxiliary attachments with a garden type tractor. This tractor includes a frame carrying a driving engine and having a single pair of wheels supported on that frame. Normal operation of the tractor requires balancing by means of a pair of operator controlled handles and this structure can be provided with a power driven rotary plow attachment. That rotary plow mechanism comprises a power drive which is mechanically coupled to the frame and drivingly engaged with the engive by selective gear means and projects axially forward of the tractor frame. Additionally, this power drive includes a right angle gear box for accepting the drive shaft of the power driven plow implement. Also, this structure is provided with a further forwardly extending support attachment device for coupling with a pair of front stabilizing wheels.

A tractor of this type is relatively unstable and can be hazardous for utilization with logs splitting attachments if specific means is not provided for preventing inadvertent motion of the tractor as well as providing additional support to prevent tipping during normal log splitting operations. While the Gravely tractor is particularly useful in various conventional operations and is readily utilized by an operator, this tractor does not incorporate the necessary gear mechanism to assure that the tractor will maintain itself in a fixed position when an operator is not immediately attending the control and directional operating handles with associated gear levers and throttle mechanisms. Also, because a tractor of this type is relatively light-weight and incapable of being self-supporting or permitting mounting of a log splitting tool directly on a wheel, as is possible with conventional four wheel type tractors, other means have necessarily been required to enable utilization a tractor of this type.

SUMMARY OF THE INVENTION

In accordance with this invention, a log splitting apparatus is provided for mounting on a garden tractor of the two wheel type, such as that manufactured and sold by Gravely. This apparatus includes a log splitting tool that is adapted to specifically engage with and be carried by an auxiliary attachment such as the power drive for a rotary type plow implement that is available for utilization with this particular tractor. Also provided in this combination is a log stop bar and the front stabilizing stand. The stop bar and stabilizing stand are incorporated in a single structure that is attachable to the power drive for the plow implement attachment. The log splitting tool includes a conically-shaped splitter head provided with a spiral auger surface and includes a mounting and drive shaft that extends axially from the base of the splitter head. This shaft is adapted to mechanically interfit with the power drive for the plow attachment. In accordance with this invention the stop bar includes an elongated tubular element which is supported in fixed relationship to the power drive and is positioned to extend in spaced parallel relationship to the conical surface of the splitter head.

Additional means are provided for securing the power drive in a position for maintaining the log splitting tool in a horizontally disposed arrangement for normal log splitting operations. This additional means also is selectively operable to effect axial rotation of the power drive means so as to position the log splitting tool and its associated stop bar in a relatively vertical disposed position particularly adapted for facilitating transport by minimizing the width of tractor and log splitting apparatus mounted thereon.

Additionally, a rear stabilizing support is provided to further enhance the safety of operation of a two-wheel garden tractor of this type provided with a log splitter apparatus of this invention. This rear stabilizing support includes a support stand having a hinged element that may be locked in either of two positions with the one position being that designed for support and stabilizing of the tractor at a rear portion. In particular, the rear stabilizing support, which can be pivotted to an inoperative transport position, is preferably located at a rear corner of the tractor frame opposite to that from which the log splitter normally extends in operative position. This rear stabilizing support thus provides, in combination with the front stabilizing stand, a particularly advantageous structure for assuring that the tractor will be securely supported and maintained in its operative position. Further, the rear stabilizing support is designed, when in its operative position, to hold the one rear wheel a distance above the ground and thus assure that the tractor would be incapable of effecting power driving and thus possibly lead to injury of the operator utilizing the log splitting apparatus.

The power drive of the plow attachment for this type of tractor is not capable of reverse motion. Since it is possible for the conically shaped splitter head to become rigidly jammed in a log, and thus preventing removal without tedious work in manually completing splitting of the log or otherwise effecting release of the log it will be noted that in accordance with this invention, the log splitting tool with the log jammed thereon may be removed from the power drive means and positioned on the opposite side where continued operation will result in reverse operation of the spiral augure surface. This reverse movement will then easily retract the splitter head from the log and thus readily clear the jam.

These and other objects and advantages of this invention will be readily apparent from the following detailed description of an illustrative embodiment thereof and the accompanying drawings.

DESCRIPTION OF THE DRAWING FIGURES

DESCRIPTION OF THE ILLUSTRATIVE EMBODIMENT

Figure 1:
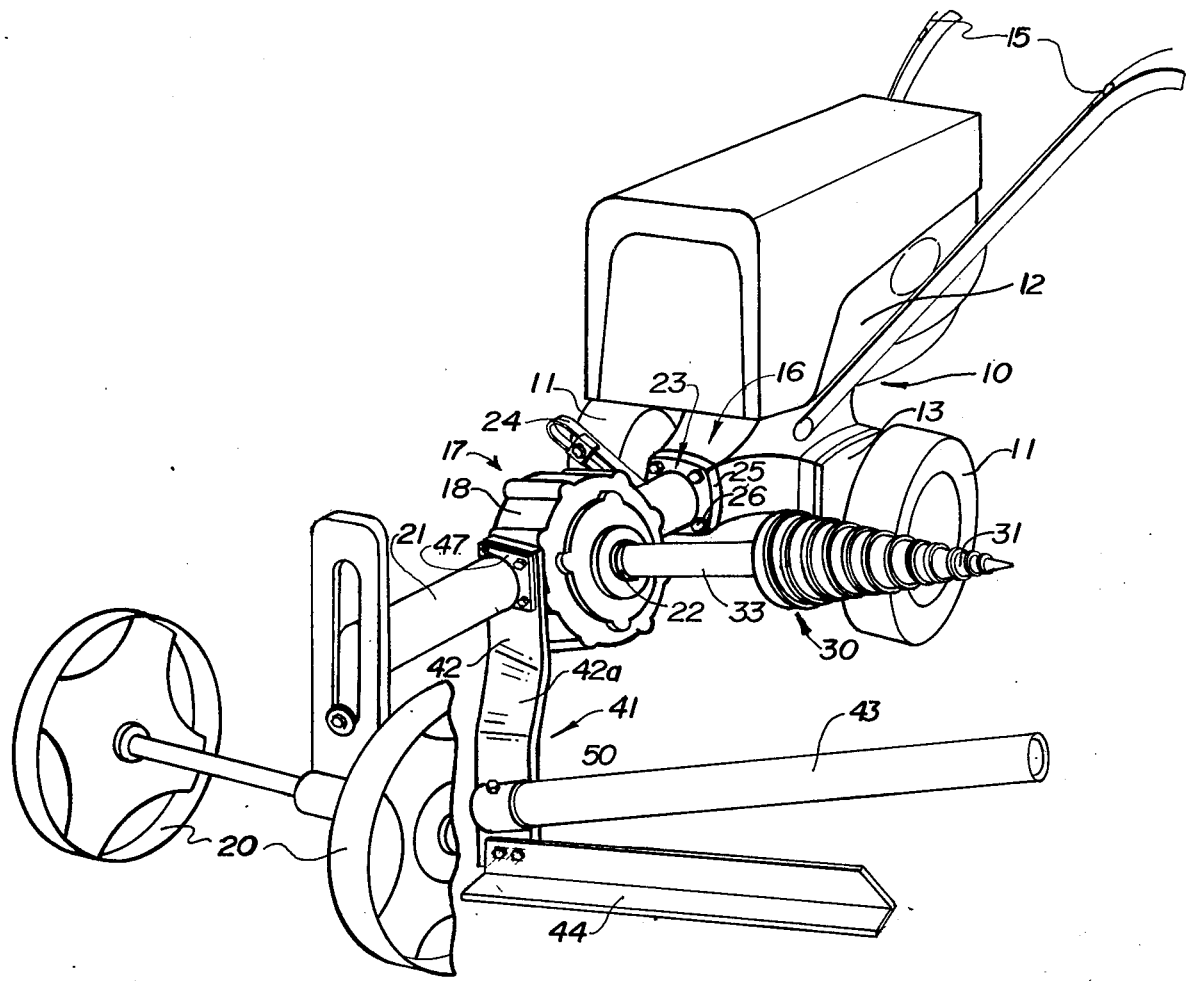
FIG. 1 is a front perspective view of a garden tractor provided with a log splitting apparatus of this invention.

Having reference to the several figures of the drawings, a tractor mounted log splitting apparatus is shown as incorporated in combination with a garden tractor of the two wheel type. This tractor includes a frame structure and a pair of drive wheels 11 and a power engine unit 12. The single pair of drive wheels 11 are secured to the frame by an axle structure 13 which incorporates a differential gear mechanism that enables the two wheels to be independently driven for steerability in normal driving operations. As is well know, this type of tractor is provided with a pair of handles 15 by which an operator normally controls movement of the tractor and which also carries the control lever mechanism such as the throttle and clutch or gear mechanism.

The tractor of the two wheeled type for which a log splitting apparatus of this invention is specifically designed, also includes a power take-off drive that enables one to mount different types of implements on the tractor and provide powered operation thereof. This power take-off includes a mounting and output drive box 16 which is mounted on the front of the tractor frame 10. One of the conventional implements that may be obtained and mounted on the tractor is a power driven rotary plow. This rotary plow attachment includes a drive and support means which is mechanically secured to the tractor frame structure at the power take-off output drive box 16 and extends in an axially forward direction relative to the tractor. This mounting and drive means, indicated generally at 17, includes a coupling and gear box unit 18 that is mechanically supported by a torque tube 19 which, in turn, is coupled mechanically to the output drive box 16. For greater stability of the tractor in utilizing the power driven rotary plow attachment, this structure also includes a pair of stabilizing wheels carried on a tubular support 21 which is bolted to and extends forwardly from the gear box unit 18.

This mounting and drive means 17 for the rotary plow attachment also includes a drive shaft (not shown) which extends through the torque tube 19 and couples with the gear mechanism in the gear box unit 18. This gear box unit 18 has an output drive element comprising an open ended tube 22 that will be noted as extending transversely through the circularly shaped gear box unit 18 and opens at each of the opposite faces thereof. This open ended tube 22 has a multisided interior surface designed to form a spline-type coupling with a similarly formed exterior surface of a coupling shaft. This tube 22 is provided with the attachment and is utilized in that manner with the power driven rotary plow although it will be understood that the gear box unit 18 will be oriented with the central axis of the drive tube 22 vertically oriented.

The torque tube 19 is secured to the output drive box 16 by a swivel coupling 23 which permits the gear box unit 18 to be revolved about the longitudinal axis of the torque tube. Means are customarily provided for securing the torque tube and the gear box unit in the desired angular position. This means includes a radially extending arm 24 and an attachment block that is bolted to the end of the drive box 16. Included in the swivel mounting is a plate 25 having a number of bolts 26 which are threaded through the plate 25 and into the drive box 16.

The log splitting tool 30 includes a conically shaped splitter head 31 which is formed with a spiral auger surface. This spiral auger surface has a thread like element 32 which may be either a right or left hand spiral as deemed appropriate for the particular drive arrangement. In this illustrative embodiment, the thread is right handed and the tool is revolved in a counterclockwise direction as viewed in FIG. 2. Rigidly secured to the splitter head 31 is an elongated mounting and drive shaft 33 that extends axially with respect to the splitter head 31 and is coaxially aligned therewith. This drive shaft 33 is formed in two sections with the one section being visible at the right side of the gear box unit 18. A terminal end portion 34 of the shaft is multisided and adapted to extend through the open ended drive tube 22 of the gear box unit. This terminal end portion 34 is preferably of a length such that it will extend a short distance outwardly from the opposite of the gear box. This exposed marginal end portion is provided with a transversely extending aperture through which a roll pin type fastening device 35 may be inserted for securing the log splitting tool 30 to the gear box unit 18. The roll pin 35 is of a length to project radially outward from each side of the shaft portion 34 and thus overlie the end face of the drive tube 22 tuus preventing withdrawal of the shaft 33. The one section of the drive shaft 33, which section is exposed at the right side of the gear box, is seen to be of a larger diameter and thus forms a shoulder 37 which rests against an end face of the drive tube 22.

Figure 2:
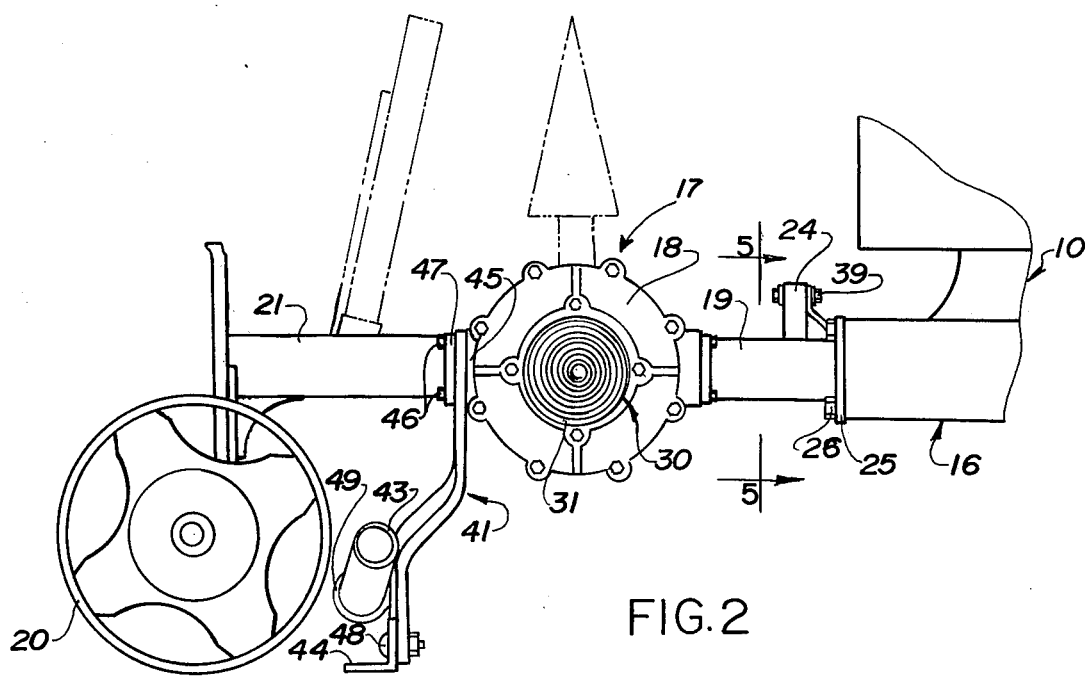
FIG. 2 is a fragmentary side elevational view as seen on the right side of FIG. 1.
Figure 3:
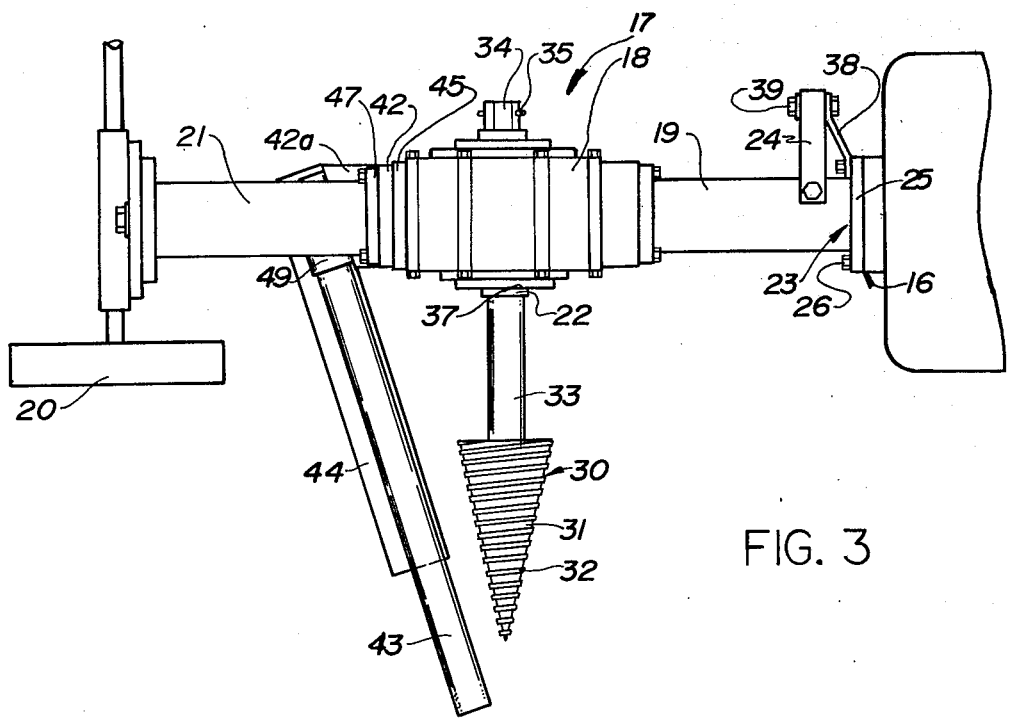
FIG. 3 is a fragmentary top plan view of the log splitting apparatus and front portion of the tractor.
Figure 5:
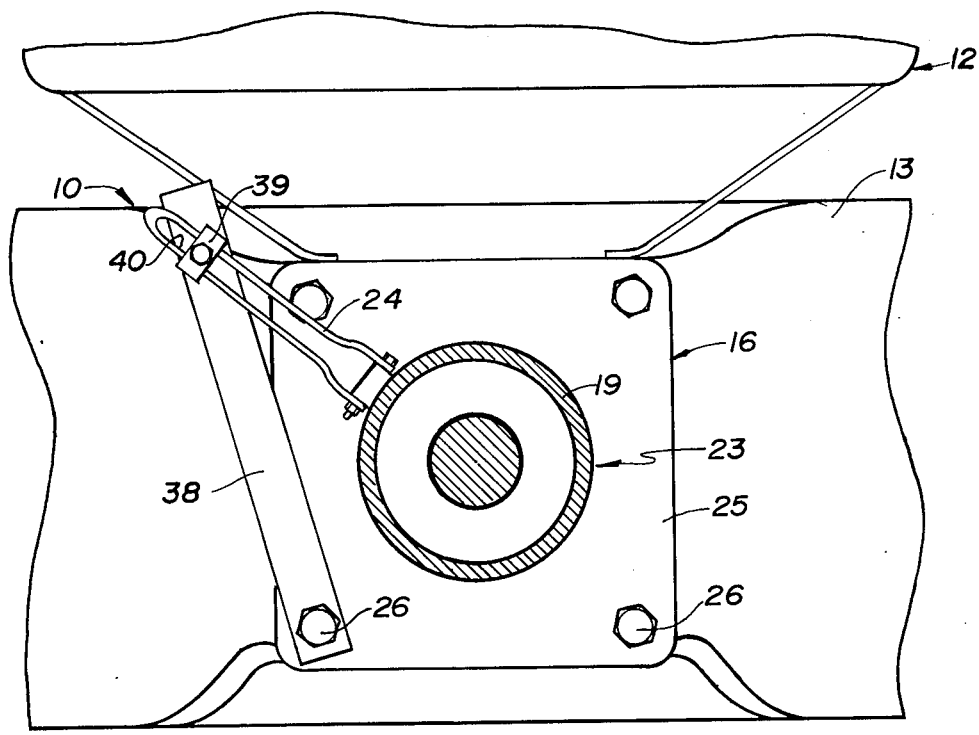
FIG. 5 is a vertical sectional view taken along line 5—5 of FIG. 2.

As illustrated in the several figures of the drawings, the gear box unit 18 is preferably positioned for normal operation such that the log splitting tool 30 will extend in a generally horizontal direction in upwardly spaced relationship to the ground surface. Securing of the gear box unit 18, and its associated mounting torque tube 19, is accomplished as previously indicated by means of the position-adjusting radial arm 24. This radial arm 24 has one end thereof rigidly secured to the torque tube and projects a distance radially outward from that tube. This arrangement can be best seen in FIG. 5 which is a fragmentary vertical sectional view providing a better illustration of the operation and functioning of this mechanism. Bolted to the end of the output drive box 16 is an adjusting bar 38. This adjusting bar has one end secured by one of the bolts 26 which includes a shoulder arrangement enabling the bar to be readily pivoted on that bolt but permitting the bolt to maintain the tight securing relationship with respect to the output drive box. Attached to the opposite end of the adjusting bar 38 is the radial arm 24. For this purpose, a clamping bolt mechanism 39 is provided and enables the operator to secure the radial arm and adjusting bar in clamped relationship to maintain the desired position of the components. The radial arm 24 will be seen to have an elongated slot 40 which thus enables the clamping bolt 39 to be moved radially outward or inward and thus obtain the desired angular position of the torque tube and the gear box unit 18 carried thereon. As seen in FIG. 2, the gear box unit is oriented to support the log splitting tool 30 in a horizontal position for the log splitting operations. As shown in broken lines in FIG. 2, it will be seen that this assembly can be relatively rotated to position the log splitting tool 30 in an upwardly directed, vertical extending position to facilitate transport. When thus positioned, the clamping bolt 39 is secured to maintain the mechanism in the desired position. It will be understood that this mechanism enables the operator to place and maintain the unit in either the horizontal operative position or the vertically oriented transport position.

Provided in accordance with this invention to facilitate operation of the log splitting tool and enhance the safety of operation in splitting of logs is a combined log stop and support assembly 41. This assembly 41 includes a support bar 42, a log stop bar 43 and a support foot 44. Mounting of the assembly 41 is accomplished by securing the upper end of the support bar 42 to a bolt attachment boss 45 which is formed on the circular periphery of the gear box unit 18. This is also the point attachment for the tubular support 21 that carries the front stabilizing wheels 20. A set of four bolts 46 form the means of attachment and extend through a bolt flange 47 which is secured to the ends of a tubular support 21. These bolts 46 also extend through mating holes formed in the upper end of the support bar 42 and thus rigidly secure the log stop and support assembly 41 to the gear box unit.

Rigidly secured to the lower end of the support bar 42 is the support foot 44 which is fabricated from an elongated section of a structural angle member. This foot may be secured to the support bar 42 by means of bolts 48 which extend through one vertical flange of this member. The other flange is horizontally disposed and adapted to engage the underlying ground surface in providing a relatively broad support surface and better stabilizing the entire unit.

Also secured to the support bar 42, at the lower end thereof, is the log stop bar 43. In the illustrative embodiment, the log stop bar 43 comprises an elongated section of a cylindrical tube that has one end thereof secured in a cylindrical socket 49. This cylindrical socket may be secured to the support bar by welding or other suitable means and retention of the stop bar is conveniently effected by means of a retaining pin 50. This retaining pin 50 projects through mating holes extending through the interengaged portions of the stop bar and socket and effectively secures the stop bar in the desired position. As illustrated, the stop bar thus projects laterally outward from the support bar in upwardly spaced relationship to the support foot and it will be seen to extend at an upwardly divergent angle and also slightly rearwardly inclined. In accordance with this invention, the upward and rearward angular positioning of the stop bar 43 is such that the bar extends in spaced parallel relationship to the exterior surface of the splitter head 31. The bar is also of a length to at least extend to, and preferably a distance beyond the extreme end or apex of the splitter head and thus defines a constant width throat through which the log that is being split may travel and progress as it moves along the splitter head 31. To achieve this desired angular positioning of the stop bar or the desired parallel relationship of the bar to the splitter head, it will be noted that the support bar 42, at an intermediate section 42a, is twisted about its vertical axis to an extent that provides the desired angular positioning. This twisting of the bar can be best seen in FIG. 2 and, in combination with the welding of the cylindrical socket 49 on the bar, provides the proper location of the stop bar. The angular positioning of the log stop bar in this manner thus obtains a throat or spacing which does not decrease in width so that jamming of logs will be effectively eliminated.

In operating the log splitting tool 30, the operator merely places the side of the log onto the apex of the splitter head 31 with sufficient force that the spiral auger tip will enter and then thread its way into the log. Preferably, a log is positioned such so the splitter head will enter adjacent one end of the log with the other end of the log thus extending over and supported by the stop bar 43. As soon as the splitter head 31 enters the log, the log will be supported entirely by the apparatus and not require further attention by the operator except to observe the progress and completion of the splitting. The log merely moves axially along the splitter head due to the thread 32 and thus slide along the stop bar 43. Consequently, it is important that the throat or spacing between the bar and the splitter head not decrease with this relative movement of the log as any decrease in width would, in the case of a relatively large log very likely result in jamming of the log and stopping of the splitting operation.

In the event that a log should become jammed for any reason, it then becomes necessary for the operator to somehow remove the log from the splitter before he can again resume the splitting operation. In accordance with this invention, since the splitter head 31 and its associated mounting and drive shaft 33, are relatively removable from the gear box unit 18 by the simple expedient of extracting the roll pin 36, it will be seen that the operator can quickly remove the splitter head with the log thus jammed onto the splitter head and simply position the shaft 33 into the gear box unit from the opposite side. With the shaft again thus positioned in the gear box drive tube 22, driving of the unit will result in a reverse rotation of the splitter head and it will then remove itself from the log. It is not necessary to do anything more than position the unit in this manner as the log will contact the ground and will merely retain that position until it falls off the splitter head.

While the unit is substantially stabilized through the incorporation of the support assembly 41 and specifically the support foot 44 engaging the ground surface during normal operation, additional stabilization has been determined advantageous for a tractor of this type. It has been found that some operator techniques, such as in assisting the unit in completing a splitting operation by pulling up on the log, result in forces being applied to the unit that would tend to either tip the garden tractor rearwardly around its main driving wheels or the unit may be laterally displaced. This results in the fact that a garden tractor of this type is relatively light in weight and is nearly balanced on the center of the main driving wheels. The attachment for the plow assembly and for the log splitting tool in this case does add some weight to the forward end of the tractor but this additional weight can be easily overcome by the operator pulling upwardly on a log that is resistant to the clean splitting operation. This occurs at times when there are fiberous strands that maintain interconnection of the two sections of the log that is otherwise completely split apart.

To further stabilize the unit during splitting operations and counteract the adverse situations described in the preceding paragraph, it is preferred to also provide a rear stabilizing support. This rear stabilizing support is generally designated at 51 and is also advantageously constructed to provide a vertical lifting of the tractor to elevate the one driving wheel to a position slightly above the ground surface. The objective of the vertical lifting is to further assure that the unit will not inadvertently be placed in driving engagement as to the drive wheels and result in the movement of the entire unit while the operator is positioned at the front end of the unit. The control mechanisms on the units of this type often do not remain properly adjusted and, after substantial use, these mechanisms cannot reliably assure that drive train will not become inadvertently engaged while the splitter is in operation due to the vibration and other movements.

Figure 4:
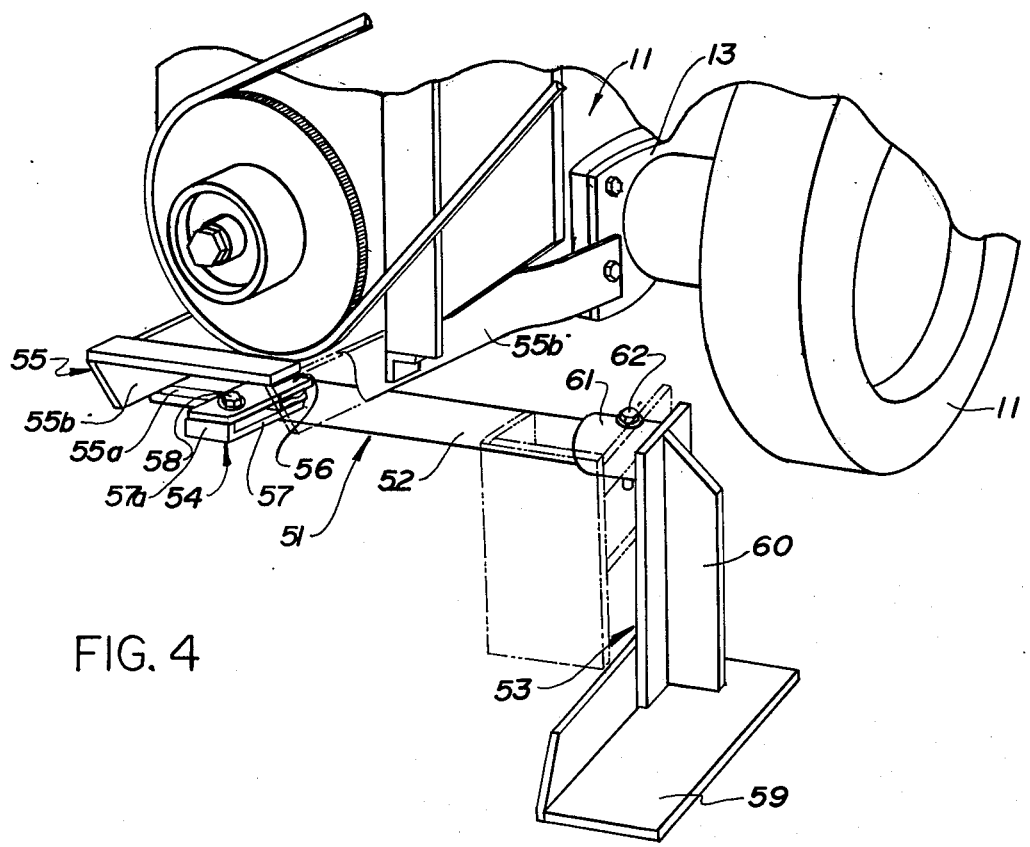
FIG. 4 is a rear perspective view of the opposite side of the tractor showing the wheel lift and stabilizing stand.

This rear stabilizing support 51 is best seen in FIG. 4 and comprises a laterally extending elongated bar 52 and a foot member 53. The elongated bar 52 is secured at one end by means of a clamp bracket 54 to a draw bar 55 that is attached to and extends rearwardly from the frame structure 10. This draw bar 55 includes a flat bar 55a secured to and extending transversely by two longitudinal supports 55b and the clamp bracket 54 includes a co-extensive plate 56 that overlies the upper surface of the flat bar 55a. The plate 56 is rigidly secured as by welding to the bar 52 in laterally extending relationship. Also included in the clamp bracket 54 is an L-shaped member 57 having one leg which is also of plate-form and underlies the flat bar 55a. This member 57 positioned so that a clamp bolt 58 may extend through the plates 56 and 57, a short leg 57a of the L-shaped member 57 projects upwardly at the rear of the draw bar 55a into engagement with the plate 56 and forms a fulcrum for operation of the clamp bracket in response to the clamping action of the bolt 58. Additionally the length of the plate 56 is such that the elongated bar 52 extends along a transversely extending edge surface of the hitch bar 55a and underlies both longitudinal supports 55b. Thus, the bar 52 will be rigidly secured to the tractor.

Adapted for mounting on the outer free end of the bar 52 is the foot member 53. This foot member 53 includes a base foot 59 and an upstanding strut 60 formed from a structural angle member. The strut 60 is rigidly secured to the foot 59, as by welding, and secured to the upper end portion of the strut is a short section of a cylindrical tube 61. This cylindrical tube is of an internal diameter such that it will readily receive the end of the round bar 52. A retaining pin 62 is provided and may be selectively positioned in one or more mating holes formed in the bar 52 and the short cylindrical tube 61. In the operative position, the pin 62 will extend through a set of holes such that the strut 60 will be vertically disposed with the base foot 59 extending horizontally to contact the ground surface. Positioning of the foot member 54 to the operative position as shown in full lines in FIG. 4, can be readily accomplished by removing the pin 62 and then pulling the tractor rearwardly to swing the unit into the operative position through relative turning of the bar 52 in the tube 61 and thereby elevating the wheel 11 at that side of the tractor. At this time, the retaining pin 62 may be returned to the position to lock the unit in the illustrated position. For transport purposes, a second set of holes are formed in the support bar 52 and enables the foot member 53 to be pivoted to a position displaced, 90° as shown in broken lines, and the retaining pin then returned to lock the unit in that position for transport.

It will be noted that the rear stabilizing support 51 is preferably positioned to extend laterally from the side of the tractor opposite to that from which the log splitting tool 30 extends. This results in the opposite wheel 11 being elevated off from the ground and thus positions the foot at a location where it can thus resist any pivoting movement that would be occasioned by the operator lifting up on a log that is in engagement with the splitter head 31.

While the tractor and log splitter tool combination is shown as retaining the front stabilizing wheels 20 with the combination, it will be understood these wheels and associated support 21 may be removed. However, retention of these components does enhance the stability of the combination and facilitate movement of the unit from one location to another. It will also be understood that the specific mechanical structures of the illustrative embodiment may be modified within the scope of this invention and retain the advantageous objectives. Also, dimensions and proportions may be altered without departing from the scope of this invention and retain the advantageous objectives. Also, dimensions and proportions may be altered without departing from the socpe of the invention.

It will be readily apparent from the foregoing detailed description of an illustrative embodiment, that particularly novel and advantageous apparatus is provided in combination with a two-wheel garden tractor for the splitting of logs. Mounting of a log splitting tool on the tractor is a simple operation through utilization of a conventionally available power drive attachment which, in conjunction a log stop and support assembly, results in a tractor mounted apparatus having excellent stability during operation and enhanced safety in operation. The log stop being mounted in spaced parallel relationship to the conically shaped surface of the splitter head prevents jamming which would otherwise result in serious damage to the apparatus and possible injury to the operator. Safety of operation is further enhanced through provision of a rear stabilizing support that is operable to lift one tractor wheel from the ground thereby positively assuring that the tractor will not inadvertently be driven but provides greater lateral stability as well as prevent tipping of the tractor about its transverse wheel axis.

Having thus described this invention, what is claimed is:

1. A tractor mounted log splitting apparatus comprising in combination
   a tractor including a frame having a longitudinal axis, and engine mounted on said frame, a pair of driven wheels mounted on said frame by a transverse axle and selectively connectable in driving engagement with said engine and
   power drive means carried on said frame in forwardly extending relationship thereto, said drive means having coupling means drivingly connectable with said engine and carried in remotely disposed relationship to said frame,
   a log splitting tool having a splitter head provided with a conically-shaped, spiral-auger surface and a mounting and drive shaft extending axially from the splitter head, said mounting and drive shaft adapted for mounting engagement with the coupling means to support said splitter head with a terminal apex thereof directed in laterally outward relationship to said power drive means and extending transversely to the frame's longitudinal axis,
   an elongated stop-bar mountable on said power drive means in fixed relationship thereto, said stop bar extending transversely to the tractor frame's longitudinal axis in spaced relationship to the surface of the splitter head forming a throat for passage of logs therethrough, and
   a ground-engaging stabilizing support carried by said power drive means and adapted to resist rotation of the tractor frame about both the transverse axle of said driven wheels and the frame's longitudinal axis, said stabilizing support including a ground engaging support foot disposed in laterally projecting relationship to the tractor frame's longitudinal axis at the same side as said log splitting tool and said stop bar.

2. Apparatus according to claim 1 wherein said stop bar extends in parallel relationship to the conically shaped surface of said splitter head.

3. Apparatus according to claim 1 having a support bar for carrying said stop bar and said stabilizing support, said support bar carried by said drive means and projecting normally downward in right angle relationship to the longitudinal axis of the tractor frame and the axis of said splitting tool, said support foot being mounted on said support bar at a position for contactingly engaging a supporting ground surface.

4. Apparatus according to claim 3 wherein said support foot comprises an elongated member disposed in parallel relationship to the axis of said splitting tool.

5. Apparatus according to claim 4 wherein said stop bar is of a length to be at least coextensive with the length of said splitter head and is supported at an end opposite the terminal apex thereof thereby forming a space for passage of logs therebetween.

6. Apparatus according to claim 5 wherein said stop bar is of a length to project a distance axially beyond the terminal apex of said splitter head.

7. Apparatus according to claim 1 wherein said power drive means includes an elongated torque tube mounted on said tractor frame and said coupling means includes a gear box unit having an output drive tube, said log splitting tool drive shaft having an end portion mechanically interengageable in said output drive tube.

8. Apparatus according to claim 7 wherein said output drive tube is open at both ends, said splitting tool drive shaft is of a length to project through said drive tube and is provided with retaining means preventing withdrawal from said output drive tube.

9. Apparatus according to claim 7 wherein said log splitting tool drive shaft has a shoulder surface for bearing against an end surface of said output drive tube to resist axially directed thrust forces.

10. Apparatus according to claim 7 wherein said output drive tube has a drive axis which is coaxial with said splitting tool drive shaft, each of said axes being oriented in transverse relationship to a longitudinal axis of said elongated torque tube.

11. Apparatus according to claim 10 wherein said torque tube is mounted on said tractor frame for rotation about the axis of said torque tube for revolution of said splitting tool thereabout.

12. Apparatus according to claim 11 including securing means interengageable between said torque tube and said tractor frame and selectively operable to fix said torque tube in a selected angular position.

13. Apparatus according to claim 12 wherein said stabilizing support and said stop bar are mounted on said gear box unit in fixed relationship thereto for rotational movement therewith.

14. Apparatus according to claim 1 which includes a rear stabilizing support carried by said tractor frame at the end thereof opposite said power drive means.

15. Apparatus according to claim 14 wherein said rear stabilizing support includes a foot member mounted for selective positioning either in a stabilizing position in contacting engagement with a supporting ground surface or in a transport position.

16. Apparatus according to claim 15 wherein said rear stabilizing support includes an elongated bar secured to said tractor frame and extending horizontally outward relative thereto in a direction opposite to that from which said log splitting tool extends, said foot member being mounted on said bar for rotation in a vertical plane about the axis of said bar, and includes fastening means cooperatively interengageable with said elongated bar and said foot member for maintaining said foot member in either the stabilizing or transport position.

17. Apparatus according to claim 16 wherein said foot member includes a base foot and a strut, said strut extending between said elongated bar and said foot member and being of a length to lift the one tractor wheel off the ground when said foot member is in said stabilizing position.

18. A tractor mounted log splitting apparatus comprising in combination
a tractor including a frame having a longitudinal axis, an engine mounted on said frame, a pair of driven wheels mounted mounted on said frame by a transverse axle and selectively connectable in driving engagement with said engine and power drive means carried on said frame in forwardly extending relationship thereto, said drive means including an elongated torque tube mounted on said tractor for rotation about the axis of said torque tube, securing means interengageable between said torque tube and said tractor operable to fix said torque tube in a selected angular position with respect to said tractor frame and coupling means drivingly connectable with said engine and carried by said torque tube in remotely disposed relationship to said frame, said coupling means including a gear box unit having an output drive tube with a drive axis oriented in transverse relationship to a longitudinal axis of said torque tube,
a log splitting tool having a splitter head provided with a conically-shaped, spiral-auger surface and a mounting and drive shaft extending axially from the splitter head, said mounting and drive shaft having an end portion mechanically interengageable in said output drive tube in coaxial relationship thereto,
an elongated stop-bar mountable on said power drive means in fixed relationship thereto, said stop bar extending in spaced relationship to the surface of the splitter head forming a throat for passage of logs therethrough, and a stabilizing support, said stabilizing support and said stop bar mounted on said gear box unit in fixed relationship thereto for rotational movement therewith.

19. A tractor mounted log splitting apparatus comprising in combination
a tractor including a frame having a longitudinal axis, an engine mounted on said frame, a pair of driven wheels mounted on said frame by a transverse axle and selectively connectable in driving engagement with said engine and power drive means carried on said frame in forwardly extending relationship thereto, said drive means having coupling means drivingly connectable with said engine and carried in remotely disposed relationship to said frame,
a log splitting tool having a splitter head provided with a conically-shaped, spiral-auger surface and a mounting and drive shaft extending axially from the splitter head, said mouting and drive shaft adapted for mounting engagement with the coupling means,
an elongated stop-bar mountable on said power drive means in fixed relationship thereto, said stop bar extending in spaced relationship to the surface of the splitter head forming a throat for passage of logs therethrough, and a rear stabilizing support carried by said tractor frame at an end thereof opposite said power drive means, said rear stabilizing support including an elongated bar secured to said tractor frame and extending outwardly relative thereto in a direction opposite to that from which said log splitting tool extends, a foot member mounted on said bar for rotation about the axis of said bar for selective positioning either in a stabilizing position in contacting engagement with a ground surface or in a transport position, and fastening means cooperatively interengageable with said elongated bar and said foot member for maintaining said foot member in either the stabilizing or transport position.

20. Apparatus according to claim 19 wherein said foot member includes a base foot and a strut, said strut extending between said elongated bar and said foot member and being of a length to lift the one tractor wheel off the ground when said foot member is in said stabilizing position.

21. A tractor mounted log splitting apparatus comprising in combination a tractor including a frame having a longitudinal axis, an engine mounted on said frame, a pair of driven wheels mounted on said frame by a transverse axle and selectively connectable in driving engagement with said engine and power drive means carried on said frame in forwardly extending relationship thereto, said drive means having coupling means drivingly connectable with said engine and carried in remotely disposed relation to said frame, a log splitting tool having a splitter head provided with a conically-shaped, spiral-auger surface and a mounting and drive shaft extending axially from the splitter head, said mounting and drive shaft adapted for mounting engagement with the coupling means, an elongated stop-bar mountable on said power dirve means in fixed relationship thereto, said stop bar extending in spaced relationship to the surface of the splitter head forming a throat for passage of logs therethrough, and a ground-engaging stabilizing support carried by said power drive means and adapted to resist rotation of the tractor frame about both the transverse axle of said driven wheels and the frame's longitudinal axis, said stabilizing support including a ground engaging support foot disposed in laterally projecting relationship to the tractor frame's longitudinal axis.

* * * * *